(12) United States Patent
Yu

(10) Patent No.: US 9,648,747 B2
(45) Date of Patent: May 9, 2017

(54) COMPANION INTEGRATED CIRCUIT HAVING DECOUPLING CAPACITOR AND MOBILE DEVICE HAVING THE SAME

(71) Applicant: SAMSUNG ELECTRONICS CO., LTD., Suwon-si, Gyeonggi-do (KR)

(72) Inventor: Jeong-Sik Yu, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/704,376

(22) Filed: May 5, 2015

(65) Prior Publication Data

US 2015/0342051 A1 Nov. 26, 2015

(30) Foreign Application Priority Data

May 22, 2014 (KR) .................. 10-2014-0061783

(51) Int. Cl.
| | |
|---|---|
| H05K 1/00 | (2006.01) |
| H05K 1/18 | (2006.01) |
| G06F 1/16 | (2006.01) |
| H01L 23/64 | (2006.01) |
| H05K 1/11 | (2006.01) |
| H05K 1/02 | (2006.01) |
| H01L 23/00 | (2006.01) |

(52) U.S. Cl.
CPC ............ *H05K 1/181* (2013.01); *G06F 1/1626* (2013.01); *H01L 23/642* (2013.01); *H05K 1/0262* (2013.01); *H01L 24/16* (2013.01); *H01L 24/32* (2013.01); *H01L 24/73* (2013.01); *H01L 2224/12105* (2013.01); *H01L 2224/16227* (2013.01); *H01L 2224/16235* (2013.01); *H01L 2224/32225* (2013.01); *H01L 2224/73253* (2013.01); *H01L 2225/06517* (2013.01); *H01L 2225/06572* (2013.01); *H01L 2225/06589* (2013.01); *H01L 2225/107* (2013.01); *H01L 2225/1035* (2013.01); *H01L 2225/1058* (2013.01); *H01L 2225/1094* (2013.01); *H01L 2924/1436* (2013.01); *H01L 2924/1438* (2013.01); *H01L 2924/15311* (2013.01); *H01L 2924/19041* (2013.01); *H01L 2924/19105* (2013.01); *H05K 1/0231* (2013.01); *H05K 1/115* (2013.01); *H05K 2201/10015* (2013.01); *H05K 2201/10734* (2013.01); *Y02P 70/611* (2015.11)

(58) Field of Classification Search
None
See application file for complete search history.

(56) References Cited

U.S. PATENT DOCUMENTS

| | | | |
|---|---|---|---|
| 6,384,476 B2 | 5/2002 | Takeuchi | |
| 6,570,248 B1 * | 5/2003 | Ahn ................. | H01L 23/49827 257/723 |

(Continued)

*Primary Examiner* — Courtney Smith
*Assistant Examiner* — Zhengfu Feng
(74) *Attorney, Agent, or Firm* — F. Chau & Associates, LLC

(57) ABSTRACT

A companion integrated circuit (IC) and a mobile device having the same are provided. The companion IC may include a decoupling capacitor that stably supplies voltage to an application processor, at least one auxiliary semiconductor device that communicates with the application processor, and a multi-chip package that includes the decoupling capacitor and the auxiliary semiconductor device.

6 Claims, 13 Drawing Sheets

(56) References Cited

U.S. PATENT DOCUMENTS

| | | | |
|---|---|---|---|
| 6,643,916 B2* | 11/2003 | Larson | H01L 23/642 29/610.1 |
| 7,292,450 B2 | 11/2007 | Larsen et al. | |
| 8,399,983 B1* | 3/2013 | New | H01L 25/18 257/686 |
| 2012/0086109 A1* | 4/2012 | Kim | H01L 21/561 257/659 |
| 2014/0084416 A1* | 3/2014 | Kang | H01L 23/50 257/532 |
| 2014/0175665 A1* | 6/2014 | Kang | H01L 23/49833 257/774 |
| 2014/0215177 A1* | 7/2014 | Kim | G06F 1/3275 711/171 |
| 2014/0340849 A1* | 11/2014 | Kim | H01L 23/34 361/717 |

\* cited by examiner

410

420

COMPANION INTEGRATED CIRCUIT HAVING DECOUPLING CAPACITOR AND MOBILE DEVICE HAVING THE SAME

CROSS-REFERENCE TO RELATED APPLICATION

This application claims priority under 35 U.S.C. §119 to Korean Patent Application No. 10-2014-0061783 filed on May 22, 2014, the disclosure of which is incorporated by reference herein in its entirety.

TECHNICAL FIELD

Exemplary embodiments of the present inventive concept relate to a companion integrated circuit (IC), and more particularly, to a companion IC which includes a decoupling capacitor in order to supply a stable voltage to an application processor and an auxiliary semiconductor device in order to provide data to the application processor, and a mobile device having the same.

DISCUSSION OF RELATED ART

Due to a high performance and low power consumption of a processor, an importance of power quality which is supplied from a system to a main processor is increasing. Further, a main processor may have a separation structure including a plurality of power domains.

To increase quality of a power supply, a decoupling capacitor of a respective power domain may be installed on a back side of the processor which is installed on a printed circuit board (PCB) substrate.

An auxiliary semiconductor device may be used for system management and an operation of the processor. The devices may be close to the main processor and provide desired functions in a system operation. Due to the compactness of a system device, installable space of a semiconductor device may gradually decrease.

SUMMARY

Exemplary embodiments of the present inventive concept provide a companion integrated circuit (IC) including a decoupling capacitor capable of providing a stable voltage to an application processor (AP) and an auxiliary semiconductor device capable of storing data which can be accessed by the AP.

Exemplary embodiments of the present inventive concept provide a mobile device include the companion IC.

Exemplary embodiments of the present inventive concept are not limited to the exemplary embodiments described herein, and other embodiments may become apparent to those of ordinary skill in the art based on the following descriptions.

In accordance with an aspect of the present inventive concept, a companion integrated circuit (IC) may include a decoupling capacitor to stably supply voltage to an application processor, at least one auxiliary semiconductor device to communicate with the application processor, and a multi-chip package including the decoupling capacitor and the auxiliary semiconductor device.

In an exemplary embodiment of the present inventive concept, the application processor may be installed on a front side of a printed circuit board (PCB) substrate, and the companion IC may be installed on a back side of the PCB substrate. The PCB substrate may include at least one through hole via (THV) and at least one build-up via (BUV). The companion IC may be connected to the application processor through at least one THV or at least one BUV.

In an exemplary embodiment of the present inventive concept, the PCB substrate may include a power management integrated circuit (PMIC) in order to supply power to the application processor. A plurality of capacitors in the decoupling capacitor may be connected in parallel between the application processor and the PMIC.

In an exemplary embodiment of the present inventive concept, a ball-map of the companion IC may correspond to a ball-map of the application processor.

In an exemplary embodiment of the present inventive concept, a thermal interface material (TIM) may be coated on the application processor, a display module may be installed on the coated TIM, the TIM may be coated on the companion IC, and a housing may be installed on the coated TIM.

In an exemplary embodiment of the present inventive concept, the companion IC may include a ball grid array (BGA) package which may have the same specifications as the application processor.

In an exemplary embodiment of the present inventive concept, the auxiliary semiconductor device may include one of an embedded multi-media card (eMMC) and an embedded multi-chip package (eMCP).

In an exemplary embodiment of the present inventive concept, the auxiliary semiconductor device may include one of a storage function, a memory function, a monitoring function, and a power supply function.

In accordance with an exemplary embodiment of the present inventive concept, a mobile device may include an application processor, a companion IC which has a ball-map corresponding to the application processor, and a PCB substrate in which the application processor is installed on a front side and the companion IC is installed on a back side. The companion IC may include a decoupling capacitor in order to stably supply voltage to the application processor, at least one auxiliary semiconductor device to communicate with the application processor, and a multi-chip package including the decoupling capacitor and the auxiliary semiconductor device.

In an exemplary embodiment of the present inventive concept, the PCB substrate may include at least one THV and at least one BUV, and the companion IC may be connected to the AP through the THV or the BUV.

In an exemplary embodiment of the present inventive concept, the application processor may include a plurality of power-balls and a plurality of signal-balls, and the decoupling capacitor may be connected to one of the plurality of power-balls of the application processor through the THV or the BUV In an exemplary embodiment of the present inventive concept, a TIM may be coated on the application processor, a display module may be installed on the coated TIM, the TIM may be coated on the companion IC, and a housing may be installed on the coated TIM.

In an exemplary embodiment of the present inventive concept, the companion IC may include a BGA package which may have the same specifications as the application processor.

In an exemplary embodiment of the present inventive concept, the auxiliary semiconductor device may include one of an eMMC and an eMCP.

In an exemplary embodiment of the present inventive concept, the auxiliary semiconductor device may include one of a storage function, a memory function, a monitoring function, and a power supply function.

In accordance with an exemplary embodiment of the present inventive concept, a mobile device may include an application processor, a companion IC which has a ball-map corresponding to the application processor, and a PCB substrate in which the application processor is installed on a front side and the companion IC is installed on a back side. The companion IC may include a decoupling capacitor in order to stably supply voltage to the application processor, an auxiliary semiconductor device to communicate with the application processor, and a multi-chip package including the decoupling capacitor and the auxiliary semiconductor device.

In an exemplary embodiment of the present inventive concept, the PCB substrate may include at least one THV and at least one BUV, and the companion IC may be connected to the application processor through the THV or the BUV.

In an exemplary embodiment of the present inventive concept, the application processor may include a plurality of power-balls and a plurality of signal-balls, and the decoupling capacitor may be connected to one of the plurality of power-balls of the application processor through the THV or the BUV.

In an exemplary embodiment of the present inventive concept, the companion IC may include a BGA package which may have the same specifications as the application processor.

In an exemplary embodiment of the present inventive concept, a TIM is coated on the application processor, and a display module may be installed on the coated TIM.

BRIEF DESCRIPTION OF THE DRAWINGS

The foregoing and other aspects of the present inventive concept will be apparent from the more particular description of exemplary embodiments of the present inventive concept, as illustrated in the accompanying drawings in which like reference characters may refer to the same parts throughout the specification and drawings. The drawings are not necessarily to scale, emphasis instead being placed upon illustrating the principles of the present inventive concept. In the drawings.

DETAILED DESCRIPTION OF THE EMBODIMENTS

Figure 1:
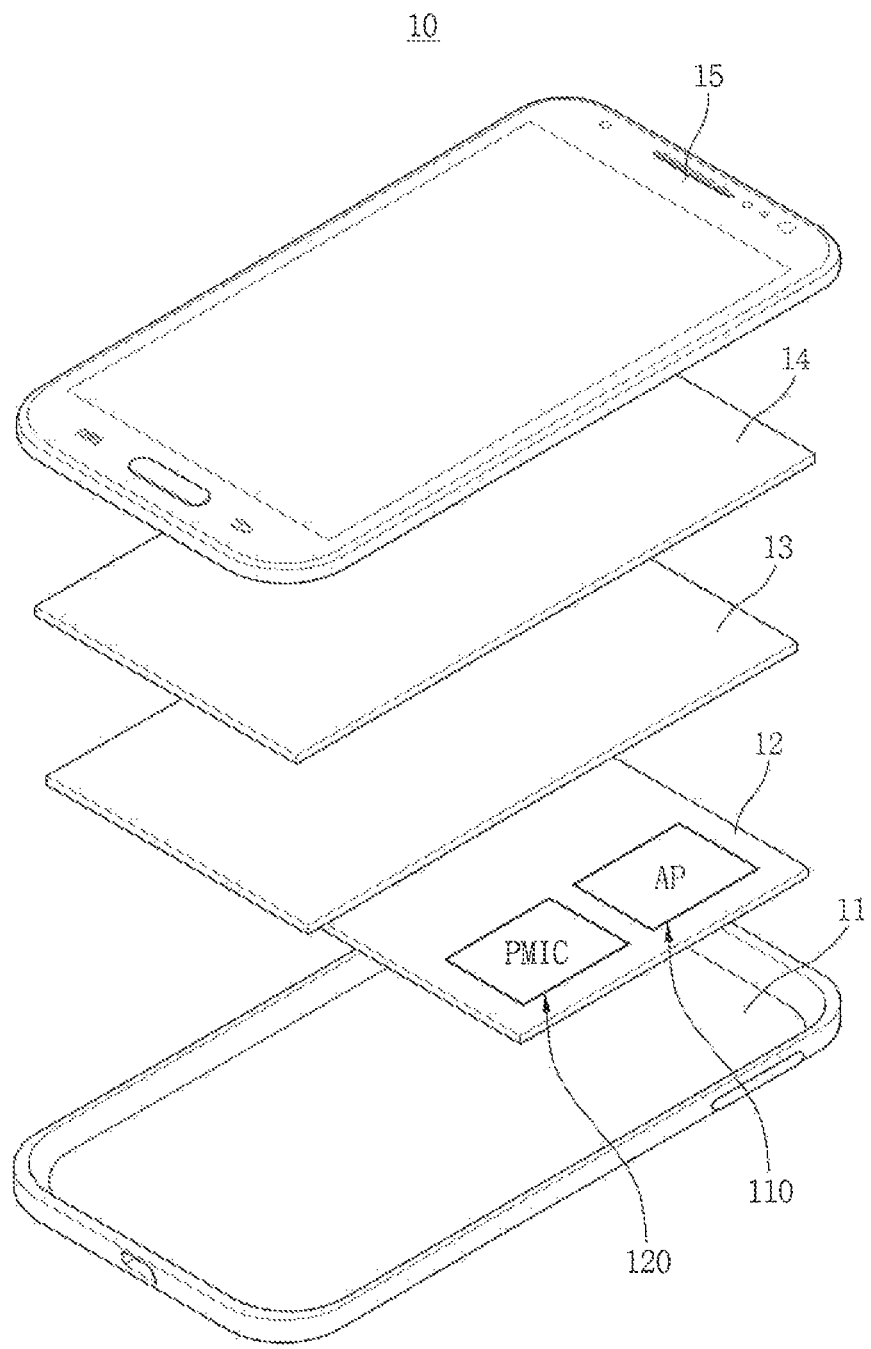
FIG. 1 is an exploded perspective view of a mobile device in accordance with an exemplary embodiment of the present inventive concept.

Example embodiments of the present inventive concept are described below in more detail to enable those of ordinary skill in the art to embody and practice the present inventive concept. It is important to understand that the present inventive concept may be embodied in many alternate forms and should not be construed as limited to the example embodiments set forth herein.

While the present inventive concept is susceptible to various modifications and alternative forms, specific embodiments thereof are shown by way of example in the drawings and will herein be described in detail. It should be understood, however, that there is no intent to limit the present inventive concept to the particular forms disclosed, but on the contrary, the present inventive concept is to cover all modifications, equivalents, and alternatives falling within the spirit and scope of the present inventive concept.

It will be understood that, although the terms "first," "second," "A," "B," etc. may be used herein in reference to elements of the present inventive concept, and such elements should not be construed as being limited by these terms. For example, a first element could be termed a second element, and a second element could be termed a first element, without departing from the scope of the present inventive concept. Herein, the term "and/or" may include any and all combinations of one or more referents.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe exemplary embodiments of the present inventive concept is not intended to limit the scope of the present inventive concept. The articles "a," "an," and "the" are singular in that they have a single referent, however the use of the singular form in the present document should not preclude the presence of more than one referent. In other words, elements of the present inventive concept referred to as in singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which the present inventive concept belongs. It will be further understood that terms in common usage should also be interpreted as is customary in the relevant art and not in an idealized or overly formal sense unless expressly so defined herein.

When it is possible to implement an exemplary embodiment in any other way, a function or an operation specified in a specific block may be performed differently from a flow specified in a flowchart. For example, two consecutive blocks may actually perform the function or the operation simultaneously, and the two blocks may perform the function or the operation conversely according to a related operation or function.

Exemplary embodiments of the present inventive concept will be described below with reference to attached drawings.

FIG. 1 is an exploded perspective view of a mobile device 10 in accordance with an exemplary embodiment of the present inventive concept.

Referring to FIG. 1, the mobile device 10 may include a housing 11, a printed circuit board (PCB) substrate 12, a display module (DM) 13, a touch sensing panel (TSP) 14, and a window cover glass 15.

A smart-phone is exemplarily illustrated as the mobile device 10 in FIG. 1. However, the mobile device 10 in accordance an exemplary embodiment of the present inventive concept is not limited to the smart-phone and may include one of various information supply devices such as a navigation device, a computer monitor, a tablet personal computer (PC), etc.

The housing 11 may accommodate internal components of the mobile device 10. FIG. 1 exemplarily illustrates that the housing 11 is formed by one component but the housing 11 may be formed by combining at least two components. The housing 11 that is formed by one component will be exemplarily described in FIG. 1. In an exemplary embodiment of the present inventive concept, the housing 11 may accommodate a power source unit (not shown) such as a battery according to a type of a display panel.

An application processor (AP) 110 that processes data using an application program and a power management integrated circuit (PMIC) 120 which supplies power to the AP 110 may be installed on the PCB substrate 12.

For example, when the AP 110 is installed on a front side of the PCB substrate 12, a companion IC including a decoupling capacitor connected to a power-ball of the AP 110 may be installed on a back side of the PCB substrate 12.

The companion IC will be described in FIGS. 6 to 9 in more detail.

In an exemplary embodiment of the present inventive concept, the AP 110 used in the mobile device 10 may include an Exynos™ (Samsung Electronics Co. Ltd.), a Snapdragon™ (Qualcomm Inc.), and a Tegra4™ (NVidia Corp.).

The display module (DM) 13 may display an image. A type of the display module (DM) 13 is not particularly limited and may be one of various display panels, e.g., an organic light-emitting display panel, a liquid crystal display panel, a plasma display panel, an electrophoretic display panel, an electrowetting display panel, etc.

The touch sensing panel (TSP) 14 may be an input unit of the display module (DM) 13 and may receive a touch signal. In an exemplary embodiment of the present inventive concept, the touch sensing panel (TSP) 14 may be embodied in an electrostatic capacitance touch panel.

The window cover glass 15 may be disposed on the touch sensing panel (TSP) 14, combined with the housing 11, and included in an outside surface of the mobile device 10 together with the housing 11.

Although not shown in FIG. 1, the mobile device 10 may include various other components such as a wireless communication unit that establishes wireless communication, a memory unit (e.g., volatile memory/non-volatile memory) that stores data, a microphone, a speaker, and an audio processor.

Figure 2:
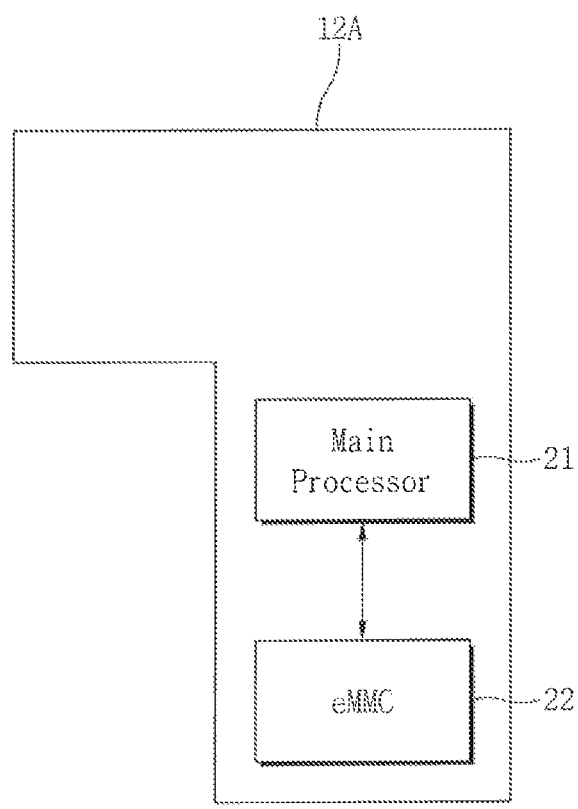
FIG. 2 is a top view illustrating a printed circuit board (PCB) substrate.

FIG. 2 is a top view illustrating a PCB substrate.

Referring to FIGS. 1 and 2, a main processor 21 may control the mobile device 10 shown in FIG. 1. In an exemplary embodiment of the present inventive concept, the main processor 21 may be an AP.

An embedded multi-media card (eMMC) 22 may include a memory device and a memory controller configured to control the memory device. In an exemplary embodiment of the present inventive concept, the eMMC 22 may include a NAND flash memory device and a flash memory controller configured to control the NAND flash memory device.

The main processor 21 and the eMMC 22 may be installed on a front side of a first PCB substrate 12A. The main processor 21 may access data from the eMMC 22 through the first PCB substrate 12A. The first PCB substrate 12A may include areas of both the main processor 21 and the eMMC 22. When the main processor 21 and the eMMC 22 are apart from each other, the first PCB substrate 12A need not be suitable for a high speed data communication.

Figure 3A:
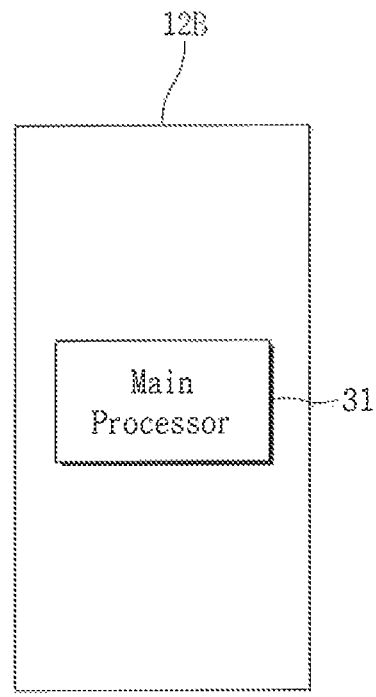
FIG. 3A is a top view illustrating another PCB substrate.
Figure 3B:
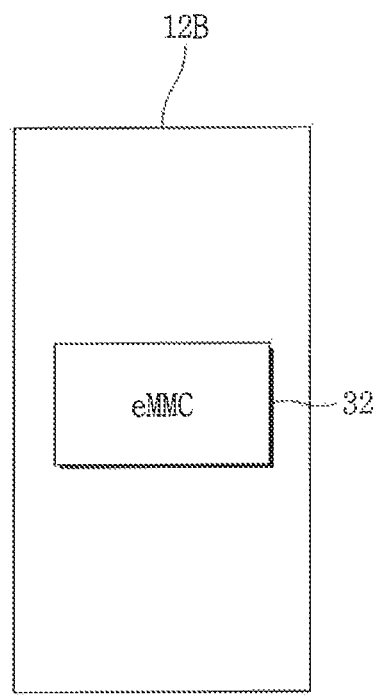
FIG. 3B is a bottom view illustrating the back side of the PCB substrate shown in FIG. 3A.

FIG. 3A is a top view illustrating another PCB substrate. FIG. 3B is a bottom view illustrating a back side of the PCB substrate shown in FIG. 3A.

Referring to FIGS. 3A and 3B, a wearable device may have a small size. Accordingly, a small-sized PCB substrate may be installed in the wearable device. A main processor 31 may be installed on the front side of the second PCB substrate 12B in the wearable device. An eMMC 32, which is connected to the main processor 31, may be installed on the back side of the second PCB substrate 12B.

The second PCB substrate 12B may include a plurality of build-up vias (BUVs) or a plurality of through hole vias (THVs). The main processor 31 may be connected to the eMMC 32 through the plurality of BUVs or THVs.

When the main processor 31 and the eMMC 32 are directly connected, the second PCB substrate 12B may be suitable for a high speed data communication. However, a decoupling capacitor for stably supplying voltage to the main processor 31 need not be directly connected to a power-ball of the main processor 31 due to the eMMC 32 which may be directly connected to the main processor 31.

Figure 4A:
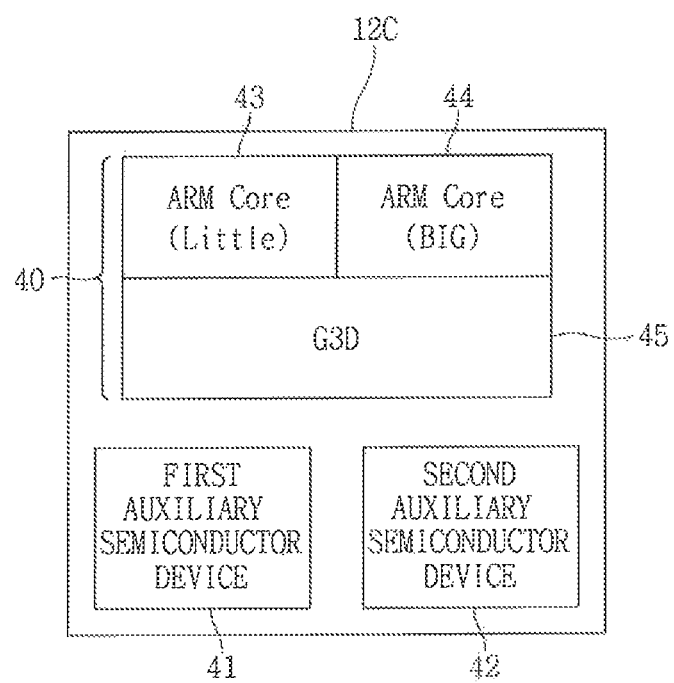
FIG. 4A is a top view illustrating another PCB substrate.
Figure 4B:
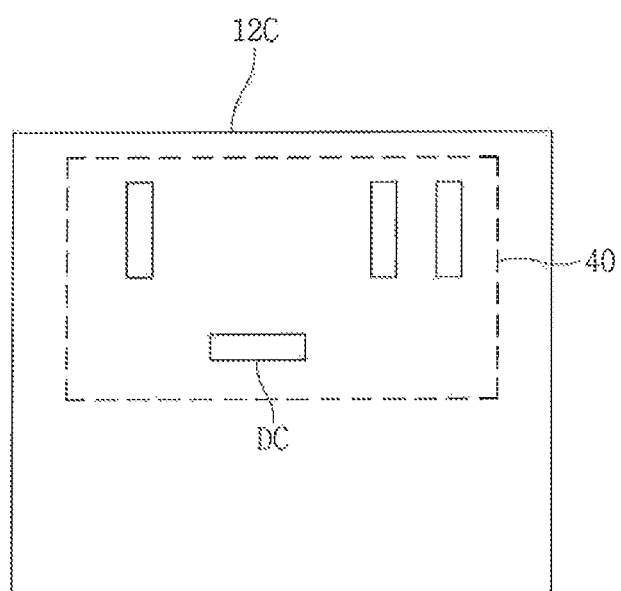
FIG. 4B is a bottom view illustrating the back side of the PCB substrate shown in FIG. 4A.

FIG. 4A is a top view illustrating another PCB substrate. FIG. 4B is a bottom view illustrating the back side of the PCB substrate shown in FIG. 4A.

Referring to FIGS. 4A and 4B, a main processor 40 and first and second auxiliary semiconductor devices 41 and 42 may be installed on the front side of the third PCB substrate 12C. The main processor 40 may access data from each of the first and second auxiliary semiconductor devices 41 and 42 through the third PCB substrate 12C. In an exemplary embodiment of the present inventive concept, the main processor 40 may be an AP.

In an exemplary embodiment of the present inventive concept, the first auxiliary semiconductor devices 41 may include an eMMC. The second auxiliary semiconductor devices 42 may include an embedded multi chip package (eMCP).

In an exemplary embodiment of the present inventive concept, the eMCP may include a NAND flash memory device, a flash memory controller configured to control the NAND flash memory device, and a volatile memory device (e.g., a dynamic random access memory (DRAM)).

The main processor 40 may include a multi-core. For example, the main processor 40 may include a little ARM core 43, a big ARM core 44, and a graphic processor G3D 45.

The main processor 40 may have a plurality of independent power regions. For example, in order to provide a power source to the big ARM core 44, the power regions may be intensively allocated at the position of the big ARM core 44.

The AP may use a dynamic voltage & frequency scaling (DVFS) method for low power consumption. The mobile device 10, which includes the AP, may need optimized power integrity (PI) in terms of a power supply.

A decoupling capacitor DC for supplying a stable voltage to the main processor 40 may be intensively allocated on the back side of the third PCB substrate 12C.

The third PCB substrate 12C may include a plurality of BUVs or a plurality of THVs. Power-balls of the main processor 40 may be connected to the decoupling capacitor DC through the plurality of BUVs or the plurality of THVs.

The decoupling capacitor DC may include a plurality of capacitors which are connected in parallel. Power-balls, which are connected to the big ARM core 44 in order to perform a high-speed operation, may be connected to many more capacitors.

Figure 5:
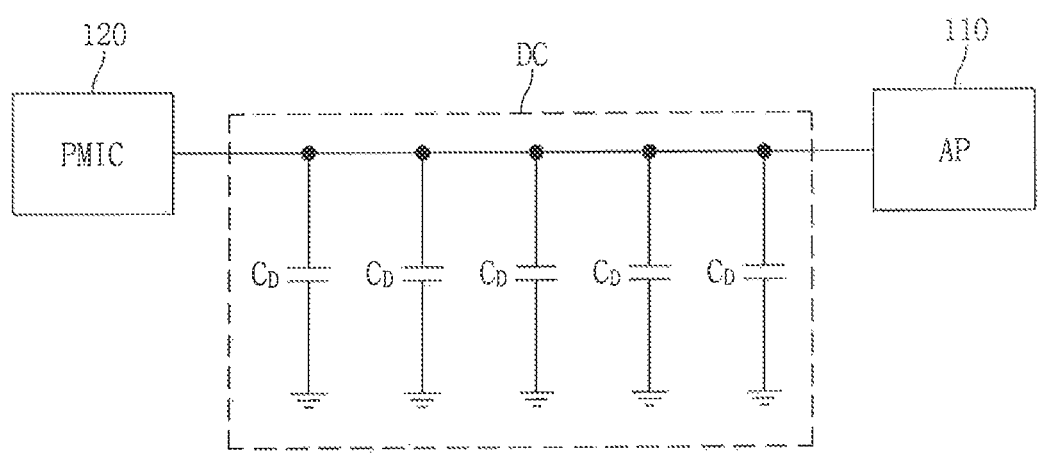
FIG. 5 illustrates a decoupling capacitor.

FIG. 5 illustrates a decoupling capacitor.

Referring to FIGS. 1, 4B, and 5, an AP 110 and a PMIC 120 which supplies a power source to the AP 110 are installed in the PCB substrate 12.

The PMIC 120 may supply a power source to the AP 110 through a power line. The plurality of capacitors of the decoupling capacitor DC may be connected to the power line in parallel. In an exemplary embodiment of the present inventive concept, the decoupling capacitor DC may include 5 or 6 capacitors for each power line. Accordingly, the AP 110 may be supplied stable power from the PMIC 120.

Figure 6:
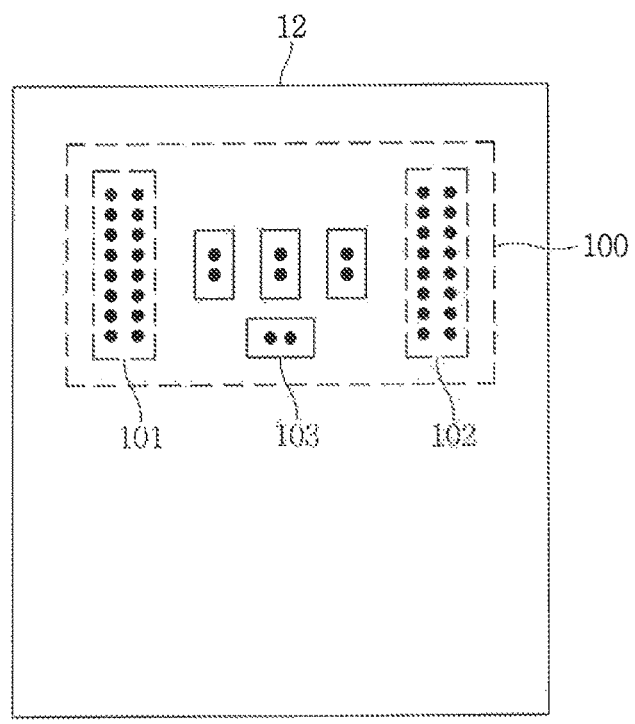
FIG. 6 illustrates a companion integrated circuit (IC) according to an exemplary embodiment of the present inventive concept.

FIG. 6 illustrates a companion integrated circuit (IC) according to an exemplary embodiment of the present inventive concept.

Referring to FIGS. 1 and 6, the companion IC 100 according to an exemplary embodiment of the present inventive concept may include the first auxiliary semiconductor device 101, the second auxiliary semiconductor device 102, and at least one decoupling capacitor 103.

In an exemplary embodiment of the present inventive concept, the first auxiliary semiconductor device 101 may include an eMMC. The second auxiliary semiconductor device 102 may include an eMCP. The decoupling capacitor 103 may be installed in the companion IC 100 as a type of an embedded capacitor.

The companion IC 100 may be embodied in a multi-chip package which includes the first auxiliary semiconductor device 101, the second auxiliary semiconductor device 102, and at least one decoupling capacitor 103. In an exemplary embodiment of the present inventive concept, the companion IC 100 may be installed on the back side of the PCB substrate 12.

Figure 7:
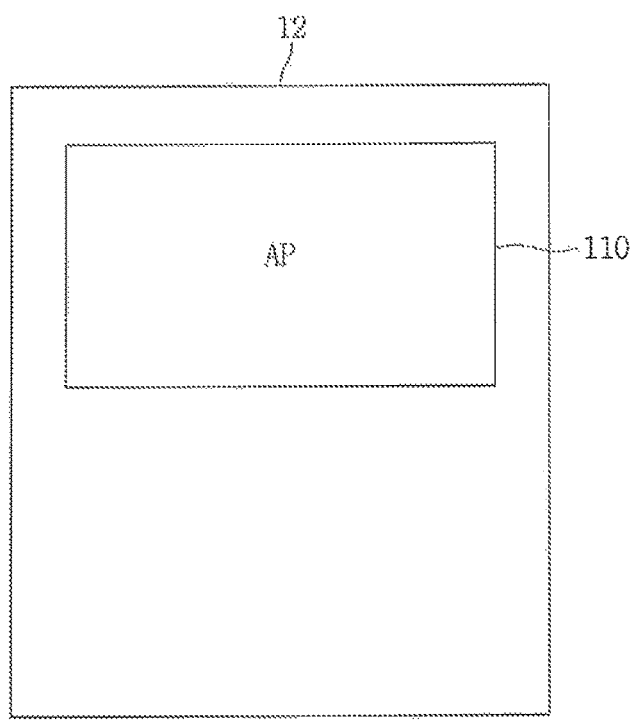
FIG. 7 illustrates an application processor connected to the companion IC shown in FIG. 6.

FIG. 7 illustrates an AP connected to the companion IC shown in FIG. 6.

Referring to FIGS. 1, 6, and 7, an AP 110 may be installed on the front side of a PCB substrate 12, and the companion IC 100 may be installed on the back side of the PCB substrate 12.

An AP 110 may be manufactured as a ball grid array (BGA) package. Accordingly, the AP 110 may include a plurality of power-balls and a plurality of signal-balls.

The PCB substrate 12 may include a plurality of THVs and a plurality of BUVs. One of the plurality of power-balls of the AP 110 may be connected to the decoupling capacitor 103 through the THV. One of the plurality of signal-balls of the AP 110 may be connected to one of the first auxiliary semiconductor device 101 and the second auxiliary semiconductor device 102 through the BUV.

In an exemplary embodiment of the present inventive concept, the first auxiliary semiconductor device 101 may include an eMMC. The second auxiliary semiconductor device 102 may include an eMCP.

Each of the first and second auxiliary semiconductor devices 101 and 102 may include one of a storage function, a memory function, a monitoring function, and a power supply function.

The storage function may include a non-volatile memory function. Each of the first and second auxiliary semiconductor devices 101 and 102 may include a flash memory device. The memory function may include a volatile memory function. Each of the first and second auxiliary semiconductor devices 101 and 102 may include a DRAM.

The companion IC 100 may have a ball-map which is symmetrical with the AP 110. Further, the companion IC 100 may be embodied in a BGA package which may have the same specifications as the AP 110.

Figure 8:
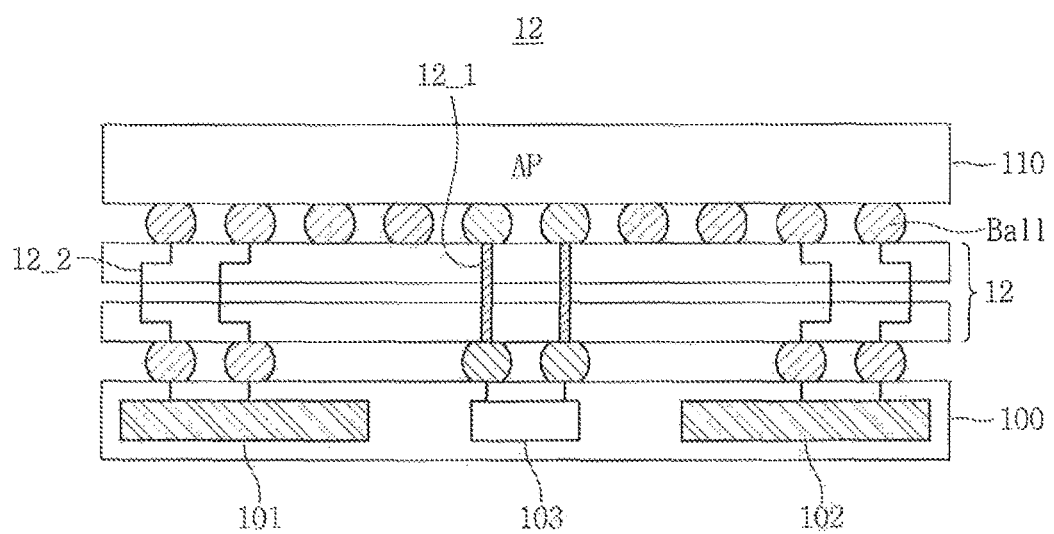
FIG. 8 is a side view illustrating an application processor and a companion IC which are installed on a PCB substrate.

FIG. 8 is a side view illustrating an AP and a companion IC which are installed on a PCB substrate.

Referring to FIGS. 6, 7, and 8, a PCB substrate 12 may include a plurality of THVs 12_1 and a plurality of BUVs 12_2.

The THV 12_1 may be a via hole which penetrates the PCB substrate 12. The BUV 12_2 may be formed as a method of stacking a conductor layer by alternatively forming a conductor layer and an isolation layer in the PCB substrate 12 formed by a multi-layer.

A ball-map of the companion IC 100 may be composed to combine with a ball-map of the AP 110. A ball-map of the companion IC 100 and the AP 110 may be described in FIGS. 9A to 10B in detail.

Each of the companion IC 100 and the AP 110 may be embodied in a BGA package.

The companion IC 100 may include the first auxiliary semiconductor device 101, the second auxiliary semiconductor device 102, and a decoupling capacitor 103. The AP 110 may include a plurality of power-balls and a plurality of signal-balls.

In an exemplary embodiment of the present inventive concept, one of a plurality of power-balls of the AP 110 may be connected to the decoupling capacitor 103 through the THV 12_1. One of a plurality of signal-balls of the AP 110 may be connected to one of the first auxiliary semiconductor device 101 and the second auxiliary semiconductor device 102 through the BUV 12_2.

Figure 9A:
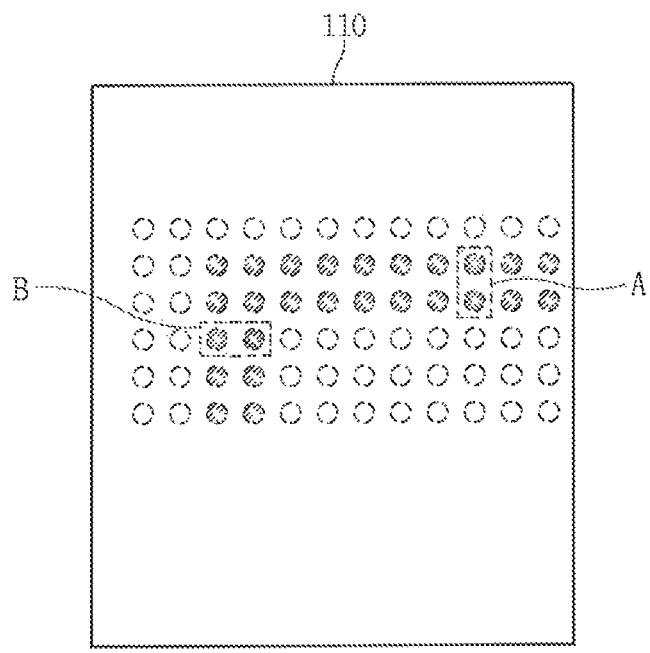
FIG. 9A is an elevation view illustrating a power-ball map of the application processor shown in FIG. 6.
Figure 9B:
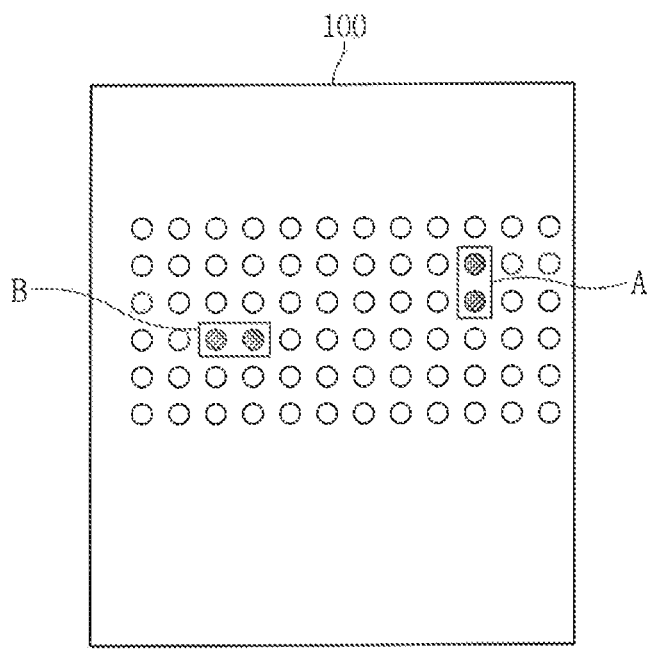
FIG. 9B is a bottom view illustrating a ball-map of a companion IC corresponding to a power-ball map of the application processor shown in FIG. 9A.

FIG. 9A is an elevation view illustrating a power-ball map of the AP shown in FIG. 6. FIG. 9B is a bottom view illustrating a ball-map of a companion IC corresponding to the power-ball map of the AP shown in FIG. 9A.

Referring to FIGS. 6, 7, 9A, and 9B, a companion IC 100 according to an exemplary embodiment of the present inventive concept may be configured to correspond to a power-ball map of the AP 110. The companion IC 100 according to an exemplary embodiment of the present inventive concept may be configured to combine with the power-ball map of the AP 110.

A position of the decoupling capacitor 103 in the companion IC 100 may be determined according to characteristics which an AP vendor requires.

When optimized positions for installing the decoupling capacitor 103 in the AP 110 are a position A and a position B, the companion IC 100 may include the decoupling capacitor 103 at each of the position A and the position B.

Set makers who manufacture the mobile device 10 may determine whether to use the companion IC 100 instead of determining an installation position of the decoupling capacitor 103.

Figure 10A:
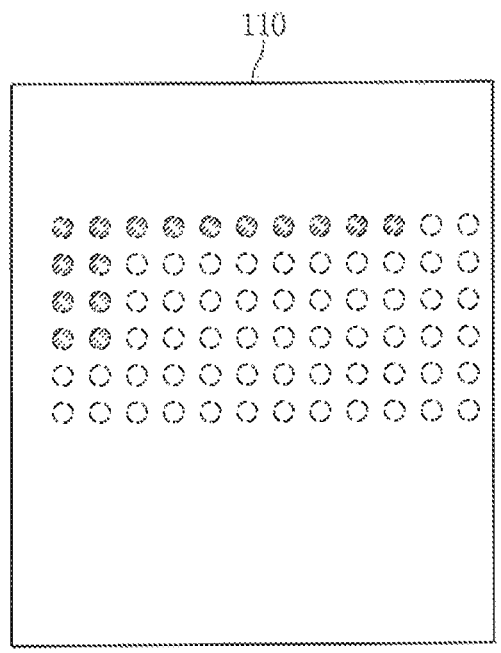
FIG. 10A is an elevation view illustrating a signal-ball map of the application processor shown in FIG. 6.
Figure 10B:
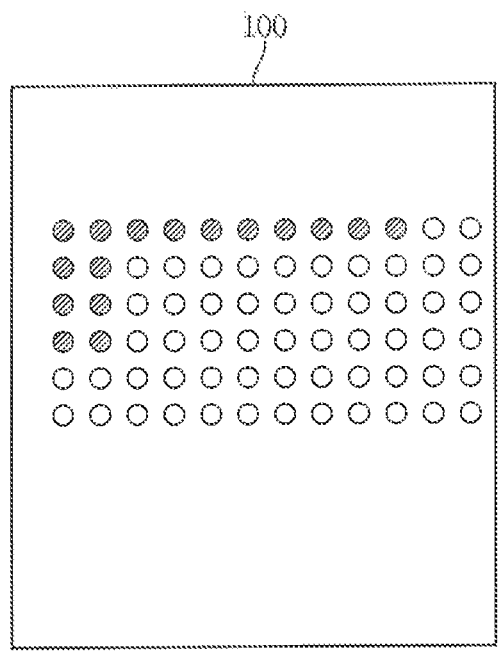
FIG. 10B is a bottom view illustrating a ball-map of a companion IC corresponding to a signal-ball map of the application processor shown in FIG. 10A.

FIG. 10A is an elevation view illustrating a signal-ball map of the AP shown in FIG. 6. FIG. 10B is a bottom view illustrating a ball-map of a companion IC corresponding to the signal-ball map of the AP shown in FIG. 10A.

Referring to FIGS. 6, 8, 10A, and 10B, a plurality of signal-balls of the AP 110 may be connected to one of the first auxiliary semiconductor device 101 and the second auxiliary semiconductor device 102 through the BUV 12_2.

Figure 11:
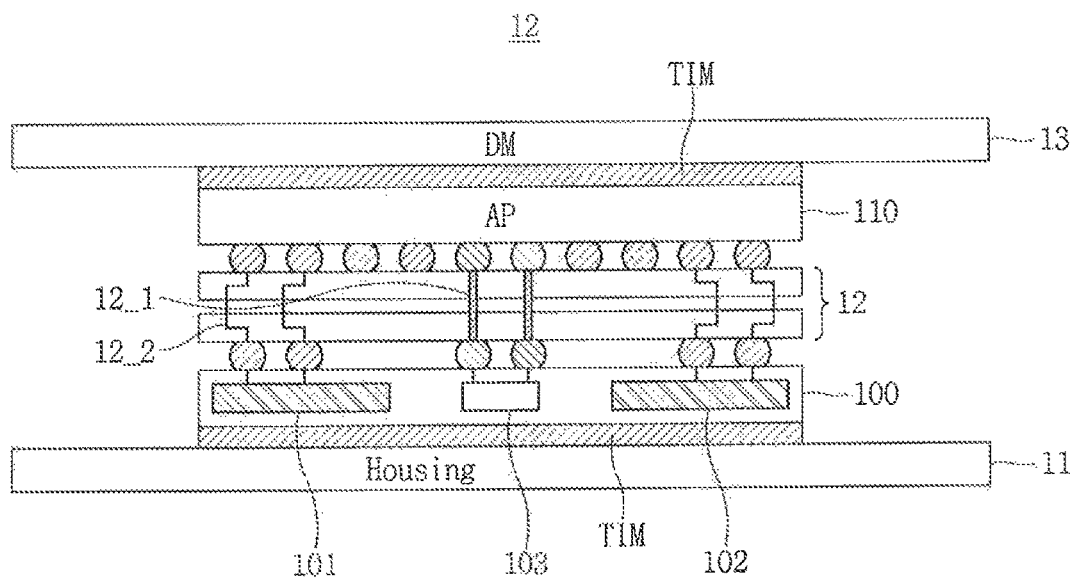
FIG. 11 illustrates a companion IC according to an exemplary embodiment of the present inventive concept.

FIG. 11 illustrates a companion IC according to an exemplary embodiment of the present inventive concept.

Referring to FIGS. 1, 8, and 11, a thermal interface material (TIM) may be coated on a top of an AP 110. A display module 13 may be installed on a top of the coated TIM. The TIM may be coated on a top of the companion IC 100, and a housing 11 may be installed on a top of the coated TIM.

In an exemplary embodiment of the present inventive concept, the companion IC 100 and the AP 110 may be connected with a plurality of THVs 12_1. Heat generated from the AP 110 may be transmitted to the companion IC 100 through the plurality of THVs 12_1.

The heat transmitted to the companion IC 100 may be transmitted to the housing 11 through the TIM. The heat generated from the AP 110 may be transmitted to the display module 13 through the TIM or the housing 11 through the companion IC 110.

Figure 12:
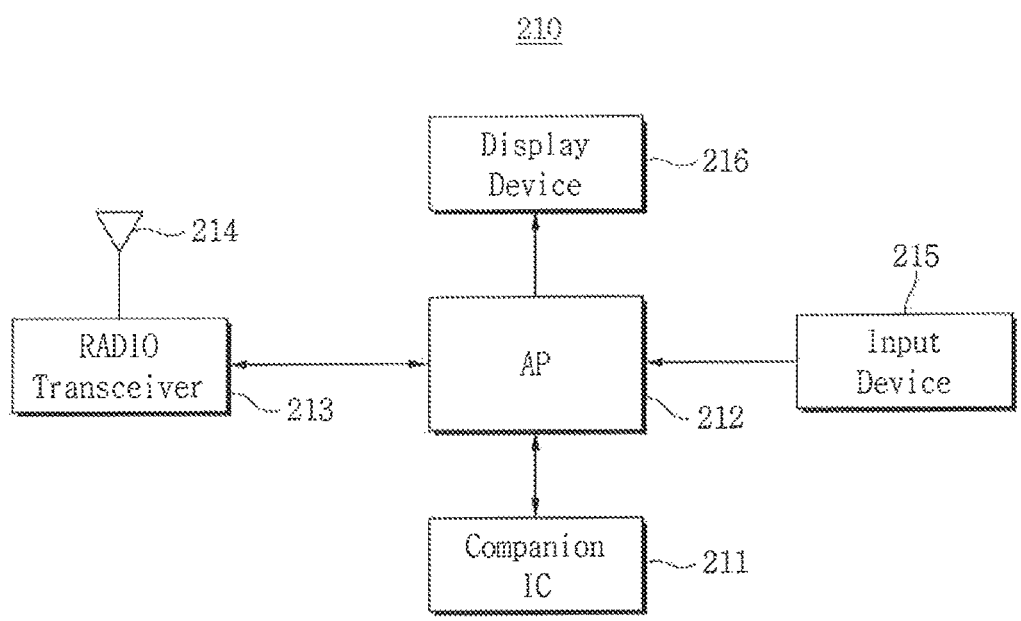
FIG. 12 is a block diagram of a computer system including the companion IC illustrated in FIG. 1 in accordance with an exemplary embodiment of the present inventive concept.

FIG. 12 is a block diagram of a computer system 210 including the companion IC illustrated in FIG. 1 in accordance with an exemplary embodiment of the present inventive concept.

Referring to FIG. 12, the computer system 210 may includes a companion IC 211, an AP 212, a radio transceiver 213, an antenna 214, an input device 215, and a display device 216. The companion IC 211 may include a memory device and a memory controller for controlling the memory device.

The radio transceiver 213 may transmit or receive a radio signal via the antenna 214. For example, the radio transceiver 213 may convert a radio signal received via the antenna 214 into a signal to be processed by the AP 212.

Thus, the AP 212 may process the radio signal that is output from the radio transceiver 213, and may transmit the processed signal to the display device 216. Also, the radio transceiver 213 may convert a signal output from the AP 212 into a radio signal, and may output the radio signal to an external device via the antenna 214.

The input device 215 may be a device through which a control signal for controlling an operation of the AP 212 or data to be processed by the AP 212 is input. The input device 215 may be embodied in a pointing device such as a touch pad or a computer mouse, a keypad, or a keyboard.

In an exemplary embodiment of the present inventive concept, the companion IC 211 may include the companion IC 100 shown in FIG. 1.

Figure 13:
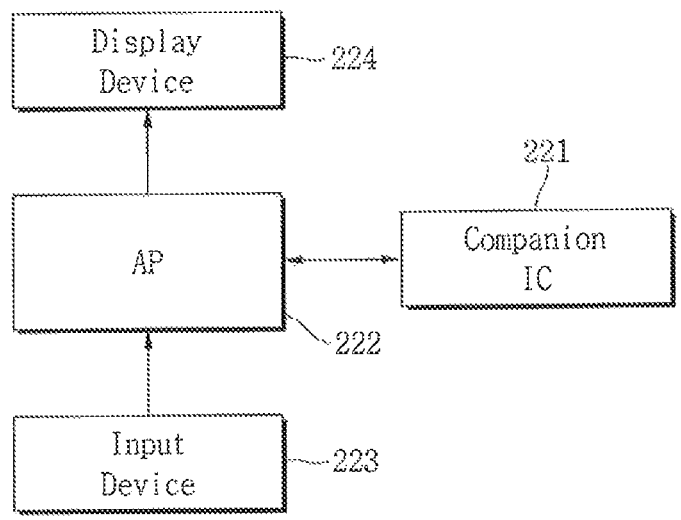
FIG. 13 is a block diagram of a computer system including the companion IC illustrated in FIG. 1 in accordance with an exemplary embodiment of the present inventive concept.

FIG. 13 is a block diagram of a computer system 220 including the companion IC illustrated in FIG. 1 in accordance with an exemplary embodiment of the present inventive concept.

Referring to FIG. 13, the computer system 220 may be embodied in a PC, a network server, a tablet PC, a netbook, an e-reader, a personal digital assistant (PDA), a portable multimedia player (PMP), an MP3 player, or an MP4 player.

The computer system 220 may include a companion IC 221, an AP 222, an input device 223, and a display device 224. The companion IC 221 may include a memory device and a memory controller for controlling the memory device.

The AP 222 may display data stored in the companion IC 221 on the display device 224 according to data input via the input device 223. For example, the input device 223 may be embodied in a pointing device such as a touch pad or a computer mouse, a keypad, or a keyboard. The AP 222 may control overall operations of the computer system 220 and an operation of the companion IC 221.

In an exemplary embodiment of the present inventive concept, the companion IC 221 may include the companion IC 100 shown in FIG. 1.

Figure 14:
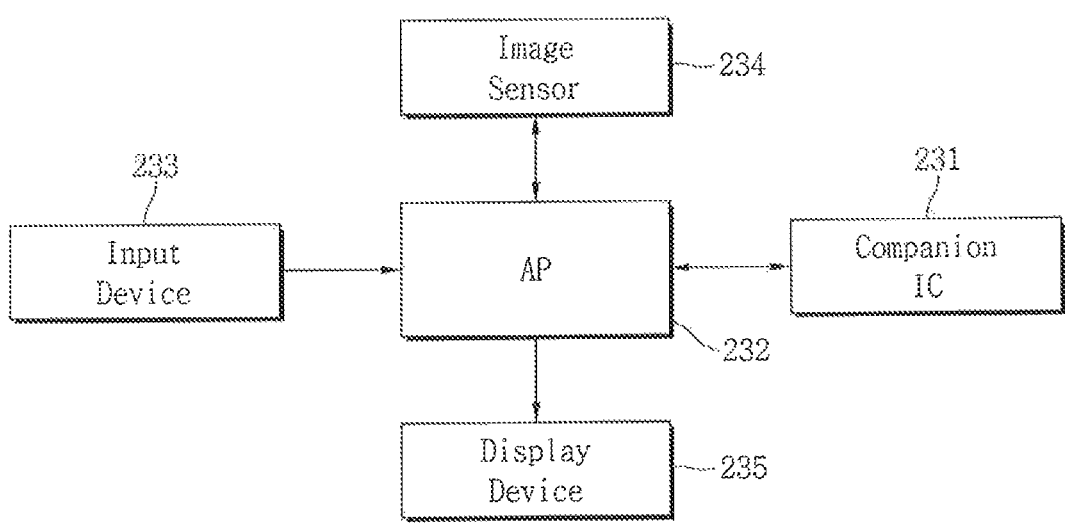
FIG. 14 is a block diagram of a computer system including the companion IC illustrated in FIG. 1 in accordance with an exemplary embodiment of the present inventive concept.

FIG. 14 is a block diagram of a computer system 230 including the companion IC illustrated in FIG. 1 in accordance with an exemplary embodiment of the present inventive concept.

Referring to FIG. 14, the computer system 230 may be embodied in an image processing device, e.g., a digital camera or a mobile phone, a smart-phone, or a tablet PC with a built-in digital camera.

The computer system 230 may include a companion IC 231, an AP 232, an input device 233, an image sensor 234, and a display device 235. The companion IC 231 may include a memory device and a memory controller for controlling the memory device.

The image sensor 234 of the computer system 230 may convert an optical image into digital signals. The digital signals may be transmitted to the AP 232. Under control of the AP 232, the digital signals may be displayed on the display device 235 or stored in the companion IC 231.

Data stored in the companion IC 231 may be displayed on the display device 235 under control of the AP 232.

The input device 233 may be a device through which a control signal for controlling an operation of the AP 232 or data to be processed by the AP 232 is input. The input device 233 may be embodied in a pointing device such as a touch pad or a computer mouse, a keypad, or a keyboard.

In an exemplary embodiment of the present inventive concept, the companion IC 231 may include the companion IC 100 shown in FIG. 1.

Figure 15:
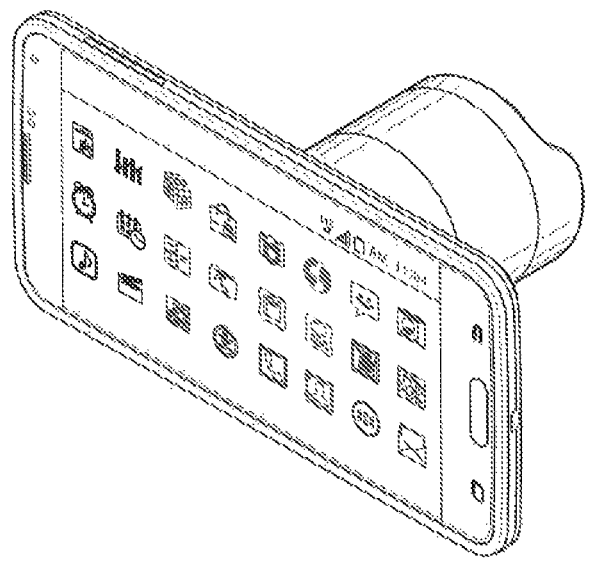
FIG. 15 illustrates a mobile device including the companion IC shown in FIG. 2.

FIG. 15 illustrates a mobile device 300 including the companion IC shown in FIG. 2.

Referring to FIG. 15, a mobile device 300 may be a digital camera device which operates with an Android™ operating system (OS). In an exemplary embodiment of the present inventive concept, the mobile device 300 may include a Galaxy Camera™ or Galaxy Camera™ 2.

The mobile device 300 may include an image sensor which captures an image or a moving picture and an AP which controls the mobile device 300.

When the AP is installed on a front side of a PCB substrate in the mobile device 300, the companion IC may be installed on a back side of the PCB substrate.

In an exemplary embodiment of the present inventive concept, the companion IC may include the companion IC 100 shown in FIG. 1.

Figure 16A:
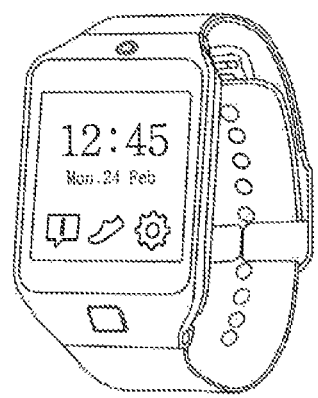
FIGS. 16A and 16B illustrate wearable devices including the companion IC shown in FIG. 1.
Figure 16B:
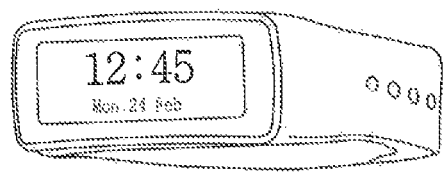

FIGS. 16A and 16B illustrate wearable devices including the companion IC shown in FIG. 1.

Referring to FIGS. 16A and 16B, each of the first and second wearable devices 410 and 420 may operate with an Android™ OS or TIZEN™ OS.

In an exemplary embodiment of the present inventive concept, the first wearable device 410 may include a Galaxy Gear™ 2, and the second wearable device 420 may include a Galaxy Gear™ fit.

Each of the first and second wearable devices 410 and 420 may include an AP which operates with an Android™ OS or TIZEN™ OS, an image sensor which captures an image or a moving image, and a display device which displays a photographed image or a moving picture.

When the AP is installed on a front side of a PCB substrate in the mobile device 300, the companion IC may be installed on a back side of the PCB substrate.

In an exemplary embodiment of the present inventive concept, the companion IC may include the companion IC 100 shown in FIG. 1.

A mobile device according to an exemplary embodiment of the present inventive concept may include a companion IC which is directly connected to an AP through a PCB substrate. The mobile device may use a small-sized PCB substrate.

The mobile device may use a clock having a high-frequency using a stable voltage.

Exemplary embodiments of the present inventive concept may be applied to a mobile device or a wearable device which include a companion IC.

While the present inventive concept has been described with reference to exemplary embodiments, it will be understood by those skilled in the art that various changes and modifications may be made without departing from the spirit and scope of the present inventive concept as defined by the appended claims.

The foregoing is illustrative of exemplary embodiments and is not to be construed as limiting thereof. Although exemplary embodiments have been described, those skilled in the art will readily appreciate that many modifications are possible without materially departing from the novel teachings of the present inventive concept. Accordingly, all such modifications are intended to be included within the scope of the present inventive concept as defined in the claims. In the claims, means-plus-function clauses are intended to cover the structures described herein as performing the recited function, and not only structural equivalents but also equivalent structures.

What is claimed is:

1. A mobile device comprising:
   a printed circuit board (PCB);
   an application processor disposed on the PCB; and
   a companion integrated circuit (IC) disposed on the PCB,
   wherein the companion IC includes:
   at least one decoupling capacitor configured to stably supply voltage to the application processor;
   at least one auxiliary semiconductor device configured to communicate with the application processor; and
   a multi-chip package including the at least one decoupling capacitor and the at least one auxiliary semiconductor device, wherein the application processor is disposed on a first surface of the PCB,
   the companion IC is disposed on a second surface of the PCB,
   the PCB includes at least one through hole via (THV) and at least one build-up via (BUV), and
   the decoupling capacitor of the companion IC is connected to the application processor through the at least one THV.

2. The mobile device of claim 1, wherein a ball-map of the companion IC corresponds to a ball-map of the application processor.

3. The mobile device of claim 1, wherein the companion IC includes a ball grid array (BGA) package which has the same specifications as the application processor.

4. The mobile device of claim 1, wherein the at least one auxiliary semiconductor device includes one of an embedded multi-media card (eMMC) and an embedded multi-chip package (eMCP).

5. The mobile device of claim 1, wherein the at least one auxiliary semiconductor device includes one of a storage function, a memory function, a monitoring function, and a power supply function.

6. The mobile device of claim 1, wherein the at least one auxiliary semiconductor device is connected to the application processor through the BUV.

* * * * *